(12) United States Patent
Chiu et al.

(10) Patent No.: US 9,154,146 B1
(45) Date of Patent: Oct. 6, 2015

(54) DYNAMIC OFFSET INJECTION FOR CMOS ADC FRONT-END LINEARIZATION

(71) Applicants: Yun Chiu, Allen, TX (US); Yuan Zhou, Dallas, TX (US); Yanqing Li, Plano, TX (US)

(72) Inventors: Yun Chiu, Allen, TX (US); Yuan Zhou, Dallas, TX (US); Yanqing Li, Plano, TX (US)

(73) Assignee: The Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/295,037

(22) Filed: Jun. 3, 2014

(51) Int. Cl.
  *H03M 1/10* (2006.01)
  *H03M 1/00* (2006.01)
  *H03M 1/12* (2006.01)

(52) U.S. Cl.
  CPC .......... *H03M 1/002* (2013.01); *H03M 1/1028* (2013.01); *H03M 1/124* (2013.01)

(58) Field of Classification Search
  CPC .............. H03M 13/1142; H03M 13/3723; H03M 13/6331; H03M 13/2957; H03M 1/002; H03M 1/124; H03M 1/1028; H03M 1/1004; H03M 1/0643; H03M 1/10; H03M 1/12; H03M 1/804; H03M 1/442; H03M 1/0695; H03M 1/1061; H03M 1/468
  USPC ........... 341/118, 120, 132, 155; 375/341, 350
  See application file for complete search history.

(56) References Cited

U.S. PATENT DOCUMENTS

| | | | |
|---|---|---|---|
| 6,606,042 B2 | 8/2003 | Sonkusale et al. | |
| 7,187,310 B2 | 3/2007 | El-Sankary et al. | |
| 7,312,734 B2 * | 12/2007 | McNeill et al. | 341/120 |
| 8,836,558 B1 * | 9/2014 | Ali | 341/132 |
| 8,981,972 B2 * | 3/2015 | Shen et al. | 341/118 |
| 2002/0175843 A1 * | 11/2002 | Sonkusale et al. | 341/120 |
| 2006/0176197 A1 * | 8/2006 | McNeill et al. | 341/120 |
| 2012/0001781 A1 | 1/2012 | Scanlan | |
| 2012/0212358 A1 | 8/2012 | Shi et al. | |

OTHER PUBLICATIONS

Peng, Bei, et al.; "An Offset Double Conversion Technique for Digital Calibration of Pipelines ADCs"; IEEE Transactions on Circuits and Systems—II: Express Briefs, vol. 57, No. 12, Dec. 2010; pp. 961-965.

Hallstrom, Claes; "Design and Implementation of a Digitally Compensated N-Bit C-xC SAR ADC Model Optimization of an Eight-Bit C-xC SAR ADC"; Department of Electrical Engineering; Sweden; Jun. 13, 2013, 83 pages.

(Continued)

*Primary Examiner* — Lam T Mai
(74) *Attorney, Agent, or Firm* — Greenberg Traurig, LLP; Ross Spencer Garsson

(57) ABSTRACT

Disclosed are systems employing a digital background calibration technique for linearizing the front-end circuits of IF-sampling ADCs. The disclosed systems and methods employ a power series model to eliminate the static nonlinearity with split-ADC architecture and LMS algorithm for background learning. The present disclosure utilizes a technique for applying two different offset signals to the input of two conversion paths in the split-ADC architecture. When the system nonlinearity is successfully calibrated, the output difference between the two conversion paths results in a fixed offset that is identical to the offset injected at the input. The disclosed digital background calibration technique can linearize the front-end circuits of high-speed ADCs and significantly reduce power consumption.

20 Claims, 12 Drawing Sheets

(56) References Cited

OTHER PUBLICATIONS

Nikaeen, Parastoo; "Digital Compensation of Dynamic Acquisition Errors at the Front-End of ADCs"; A dissertation submitted to the Department of Electrical Engineering and the Committee on Graduate Studies of Stanford University in partial fulfillment of the requirements for the Degree of Doctor of Philosophy; Sep. 2008, 139 pages.

Chiu, Yun, et al.; "Least Mean Square Adaptive Digital Background Calibration of Pipelines Analog-to-Digital Converters"; IEEE Transactions on Circuits and Systems—I: Regular Papers, vol. 51, No. 1, Jan. 2004, pp. 38-46.

Tsang, Cheongyuen (Bill); "Digitally Calibrated Analog-to-Digital Converters in Deep Sub-micron CMOS"; Electrical Engineering and Computer Sciences, University of California at Berkeley, Technical Report No. UCB/EECS-2008-67, May 22, 2008, 188 pages.

* cited by examiner

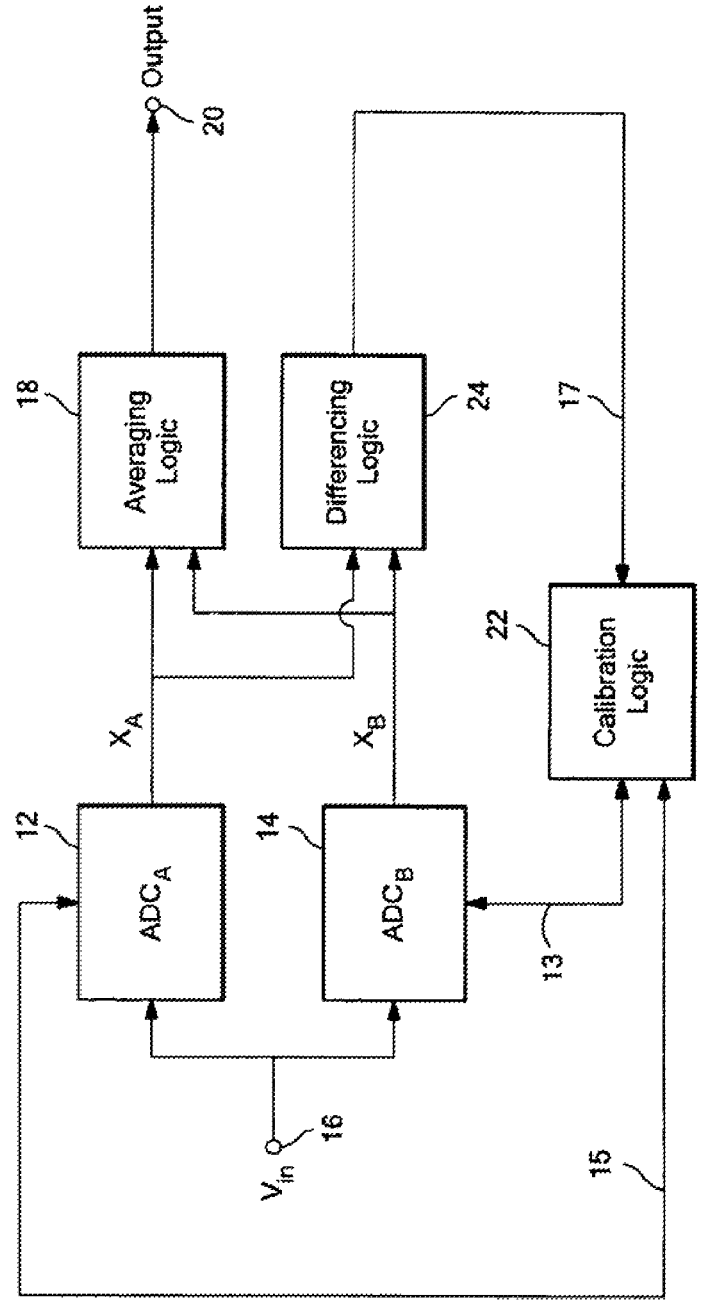

DYNAMIC OFFSET INJECTION FOR CMOS ADC FRONT-END LINEARIZATION

This application includes material that is subject to copyright protection. The copyright owner has no objection to the facsimile reproduction by anyone of the patent disclosure, as it appears in the Patent and Trademark Office files or records, but otherwise reserves all copyright rights whatsoever.

FIELD

The present disclosure generally relates to calibrating analog-to-digital converters, and more particularly to methods and systems for linearization and calibration of analog-to-digital converters during intermediate-frequency (IF) sampling.

RELATED ART

Conventional analog-digital converter (ADC) front end design techniques are based upon input buffering, clock bootstrapping, bottom-plate sampling and back-gate driving. Conventional techniques can be effective in isolating the sampler switching noise from the input network and implementing an impedance step-down transformation for a large front-end bandwidth. Other techniques involve charge resetting which removes memory in samplers in order to insert a reset phase to neutralize the charge on the sampling capacitors. Such techniques are often utilized in fully differential circuits and/or with dummy capacitors. In a practical ADC front-end circuit, a subset or all of the above techniques can be employed to ensure an overall good performance. However, such conventional approaches are inhibited by two main limitations: a high supply voltage and large power consumption. Such limitations are particularly evident upon integration with an ADC core in scaled CMOS process nodes.

SUMMARY

The present disclosure provides systems and methods that can linearize the front-end circuits of high-speed ADC and significantly reduce power consumption. As discussed in more detail herein, the disclosed systems and methods employ a digital background calibration technique for use in intermediate-frequency (IF) sampling ADCs. The disclosed systems and methods can improve linearity of the front-end buffer which limits ADC performance at intermediate frequencies. The disclosed linearization techniques utilize dynamic offset injection, built upon offset double conversion (ODC), to calibrate the non-linearity of the front-end buffer of IF-sampling ADCs. The disclosed calibration operates in the background without the need of stopping normal operation. By implementing the disclosed systems and methods, the front-end buffer can be integrated with the ADC core in scaled process nodes. Thus, the present disclosure describes techniques for significantly decreasing the power consumption and manufacture costs of IF-sampling ADCs.

In accordance with one or more embodiments, a method is disclosed that includes steps for linearization and calibration during intermediate-frequency (IF) sampling, as discussed herein. In accordance with one or more embodiments, a system is provided that comprises one or more computing devices configured to provide functionality in accordance with such embodiments. In accordance with one or more embodiments, functionality is embodied in steps of a method performed by at least one computing device. In accordance with one or more embodiments, program code to implement functionality in accordance with one or more such embodiments is embodied in, by and/or on an apparatus.

The principles of the present disclosure can be embodied in varying techniques, as discussed in more detail below. Thus, it should be understood that the various embodiments of the present disclosure may include some, all, or none of the enumerated technical advantages. In addition, other technical advantages of the present disclosure may be readily apparent to one skill in the art from the figures, description and claims included herein.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure:

FIG. 1 is a high-level schematic block diagram of a calibratable analog-to-digital converter system in accordance with some embodiments of the present disclosure;

DESCRIPTION OF EMBODIMENTS

Figure 2A:
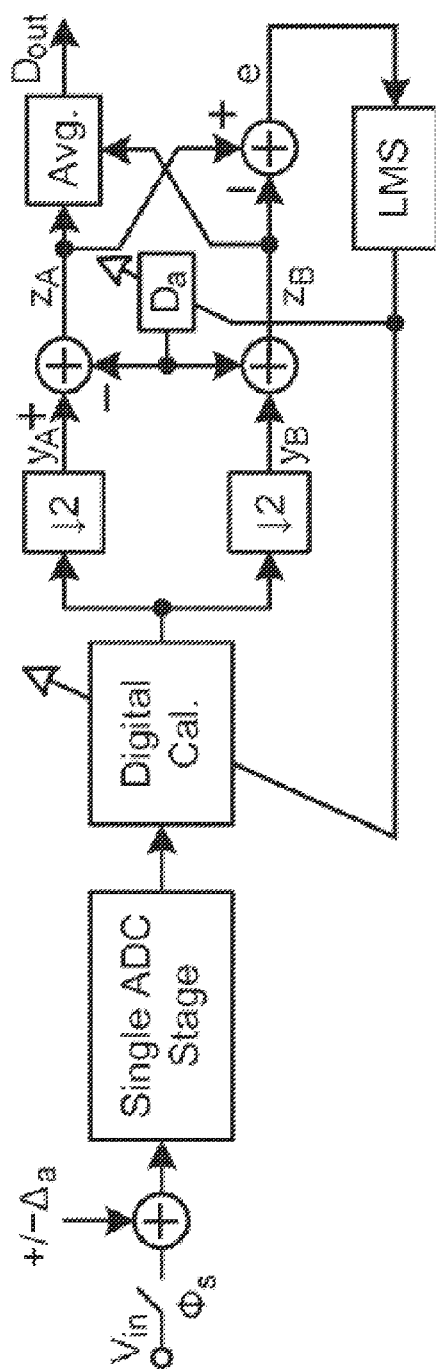
FIGS. 2A-2B illustrate a calibration scheme in accordance with some embodiments of the present disclosure.

The present disclosure will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as devices, components, methods or systems. The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure is described below with reference to block diagrams and operational illustrations. It is understood that each block of the block diagrams or operational illustrations, and combinations of blocks in the block diagrams or operational illustrations, can be implemented by means of analog or digital hardware and computer program instructions. These computer program instructions can be provided to a processor of a general purpose computer, special purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved. These computer program instructions can be provided to a processor of a general purpose computer, special purpose computer, ASIC, or other programmable data processing apparatus, such that the instructions, which execute via the processor of the computer or other programmable data processing apparatus, implement the functions/acts specified in the block diagrams or operational block or blocks.

The principles described herein may be embodied in many different forms. By way of background, an analog-to-digital converter (ADC) is a device that converts an analog signal input to a digital output code. ADC devices exist in the market with different specifications, architectures, resolutions, accuracies, power requirements, and the like. Indeed, ADC devices cover a range of performance needs and are utilized for a variety of differing applications. ADC devices work well for certain applications while for others they have disadvantages. Such disadvantages include, but are not limited to, the introduction of dynamic errors in ADC front-end circuits that in turn limit the ADC's performance at intermediate frequencies (IF). These errors in ADC circuits deviate due to various sources of inaccuracy through the conversion process and its manufacturing process common to all integrated circuits.

In general, conventional ADC front-end design techniques include, but are not limited to, input buffering, charge resetting, clock bootstrapping, bottom-plate sampling and back-gate driving. Such techniques can be effective in isolating the sampler switching noise from the input network and implementing an impedance step-down transformation for a large front-end bandwidth. Some techniques, such as charge resetting, are implemented to neutralize the charge on the sampling capacitors. Such techniques are often utilized in fully differential circuits and/or with dummy capacitors. In a practical ADC front-end circuit, a subset or all of the above techniques can be employed to ensure an overall good performance. However, such conventional approaches are inhibited by a high supply voltage and large power consumption, which become evident upon integration with an ADC core in scaled process nodes.

As discussed in more detail below, the present disclosure provides systems and methods that can linearize the front-end circuits of high-speed ADC and significantly reduce power consumption. As discussed herein, an ADC application such as, but not limited to, sampling at an Intermediate Frequency (IF) is an attractive method for minimizing component count and system cost. By applying such disclosed techniques, one or more steps of down-conversion are removed from the receiver path and some of the analog front-end signal processing functions can be moved to the digital domain. As discussed in more detail herein, the disclosed systems and methods employ a digital background calibration technique for use in intermediate-frequency (IF) sampling ADCs. That is, the present disclosure provides for digital background calibration techniques that linearize the front-end circuits of IF-sampling ADCs. The disclosed linearization techniques utilize dynamic offset injection, built upon offset double conversion (ODC), to calibrate the non-linearity of the front-end buffer of IF-sampling ADCs. The disclosed calibration operates in the background without the need of stopping normal operation. In some embodiments, a power series model is utilized to eliminate the static non-linearity with split-ADC architecture and a least-mean-squares (LMS) algorithm/filter for background learning. As discussed in more detail below, the present disclosure utilizes a technique(s) for applying two dynamic offset signals to the input of two conversion paths in the split-ADC architecture. When the system nonlinearity is successfully calibrated, the output difference between the two conversion paths results in a fixed offset that is identical to the offset injected at the input. Therefore, as discussed in more detail below, the present disclosure describes techniques for linearizing the front-end circuits of ADCs, and significantly decreasing the power consumption and manufacture costs of such IF-sampling ADCs.

Certain embodiments will now be described in greater detail with reference to the figures. FIG. 1 illustrates split-ADC architecture—system 100. System 100 depicts a calibratable ADC system, with according to a non-limiting example, has at least two ADCs: $ADC_A$ 12 and $ADC_B$ 14. Each ADC, according to some embodiments, is configured to convert the same analog signal at input 16 to a digital signal. Thus, $ADC_A$ outputs digital signal $X_A$ and $ADC_B$ outputs digital signal $X_B$. In a typical implementation, as understood by those of skill in the art, averaging logic 18 averages the digital output signals of both ADCs to produce a system output code at 20. For example, the output code is $(X_A+X_B)/2$. Calibration logic 22 is responsive to the individual digital signals output by $ADC_A$ and $ADC_B$ and can be configured to calibrate each of the ADCs based on their output signals $X_A$ and $X_B$. In some embodiments, differencing logic 24 can subtract the signals output by $ADC_A$ from the signal output by $ADC_B$ and calibration logic 22 uses this difference ($\Delta X$) to calibrate each ADC until the difference between the digital signals output by $ADC_A$ and $ADC_B$ is minimized, e.g., zero.

Calibration logic, employed by calibration logic 22, is responsive to the decisions made by each ADC via channels 13 and 15. Logic 22 is also responsive to the differences between the digital signal output by each ADC on channel 17 and calibration logic 22 is configured to calculate the errors in each ADC and to drive the errors to a minimum. Such architectures for ADCs 12 and 14 can include, but is not limited to, cyclic, successive approximation (SAR), interleaved, pipeline and/or split ADC architectures as discussed below. If there are N ADCs, each ADC may be designed to occupy 1/N of the area of the system 100, and to consume 1/N of the power of the system 100. In some embodiments, calibration logic 22 can be deterministic. That is, the calibration logic is not based on the statistical characteristics of the ADC output.

Conventional CMOS ADC design employs all-digital self-calibrating ADC architectures. Such calibration involves an N-bit converter by statistical, non-deterministic means requiring approximately $2^{2N}$ conversions. Although this may be adequate for ADCs of high speed and moderate resolution, higher resolution converters have required calibration times of seconds or minutes. In contrast, the "split ADC" architecture shown in FIG. 1 enables a deterministic digital calibration procedure which operates continuously in the background and much more efficient. As depicted in FIG. 1, the ADC system 100 is split into two channels, each converting the same input and producing individual output codes $X_A$ and $X_B$. The average of the two outputs is the ADC output code at node 20. As discussed above, the background calibration signal is developed from the difference $\Delta X$ between codes $X_A$ and $X_B$. In some embodiments, if both ADCs are correctly calibrated, the two outputs agree and the difference $\Delta X=0$. In some embodiments, in the presence of non-zero differences, a pattern respective $\Delta X$ can be examined by calibration logic 22 to adjust the calibration parameters in each ADC, driving the EX and the ADC errors to zero.

As discussed above, the disclosed linearization techniques utilize dynamic offset injection to calibrate the non-linearity of the front-end buffer of IF-sampling ADCs. Such techniques are built upon offset double conversion (ODC). In contrast to the non-deterministic approach, discussed above, which have drawbacks, including slow correction of errors, the present disclosure is an expansion on ODC which is an implementation of calibrating the inter-stage gain errors, harmonic distortions and mismatch errors in ADCs. The disclosed linearization technique executes in background mode without interrupting normal ADC operation. In some embodiments, the disclosed techniques involve utilizing a double conversion of the same sample to derive the error statistics to perform a simultaneous calibration, thereby ensuring a short convergence time.

Figure 2B:
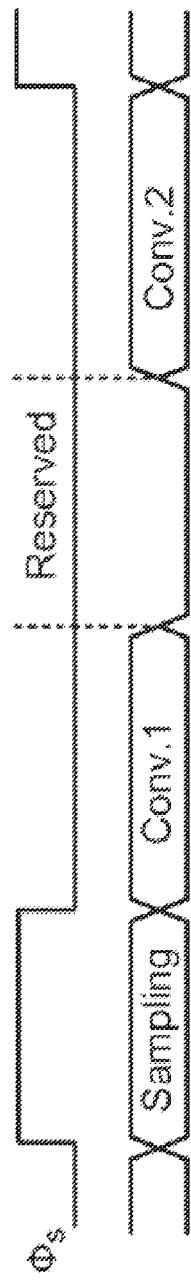

FIGS. 2A-2B illustrate a calibration scheme using a single pipelined ADC via ODC. That is, FIG. 2A illustrates the schematic block diagram for implementing such calibration scheme, according to some embodiments, and FIG. 2B illustrates an example of timing diagrams for such background calibration. According to some embodiments, as illustrated at least in FIG. 2A, one complete conversion process consists of one sampling phase and two conversion phases, in which the ADC performs the same digitization twice, perturbed by two additive offsets $+\Delta a$ and $-\Delta a$, with subsequent digital calibration to correct the conversion errors [3]. In FIG. 2A, it can be assumed for sake of explanation, for example, that the cascaded system of the single ADC stage and the digital correction is a memory-less nonlinear function $h(\cdot)$, which can be approximated by a power series:

$$h(x) = \sum_{i=1}^{\infty} h_i x^i \qquad (1)$$

where x is the input sample, {hi for i≥1} are the coefficients of the polynomial, and a dc term is neglected here for simplicity. Then, the two conversion results of the input sample $z_A$ and $z_B$ in FIG. 2A can be expressed as:

$$z_A = h(x + \Delta_a) - D_a = \sum_{i=1}^{\infty} h_i(x + \Delta_a)^i - D_a \qquad (2)$$

$$z_B = h(x - \Delta_a) + D_a = \sum_{i=1}^{\infty} h_i(x + \Delta_a)^i + D_a$$

where $D_a$ is the digital version of $\Delta_a$. Note, in some embodiments, that Da (digital domain) and $\Delta$a (analog domain) are potentially mismatched. The average of the two conversion outputs is reported as the final output code Dout given by:

$$D_{out} = h_1 x + \frac{1}{2}\left(\sum_{i=2}^{\infty} h_i((x+\Delta_a)^i + (x-\Delta_a)^i)\right) \qquad (3)$$

where the first term is the input sample with a gain error, and the second term captures the nonlinear distortion of the conversion process. If the digital calibration corrects both the gain error and nonlinear distortion successfully, then h1=1 and hi=0 for all i≥2. At the same time, the difference between the two outputs can be expressed as:

$$\varepsilon = z_A - z_B = 2(h_1\Delta_a - D_a) + \sum_{i=2}^{\infty} h_i((x+\Delta_a)^i - (x-\Delta_a)^i). \qquad (4)$$

In some embodiments, h1=1, $\Delta$a=Da, and hi=0 for all i≥2 (which means the cascaded system of the ADC and digital correction is linear); then, the difference e must be zero. In other words, a nonzero e will provide information to acquire all {hi for i≥2} and $\Delta$a. This can be implemented using a gradient-descent algorithm, e.g., the LMS algorithm shown in FIG. 2A. Note, Da can be adaptive to track the exact value of $\Delta$a in this scheme, as shown in FIG. 2A.

Figure 3A:
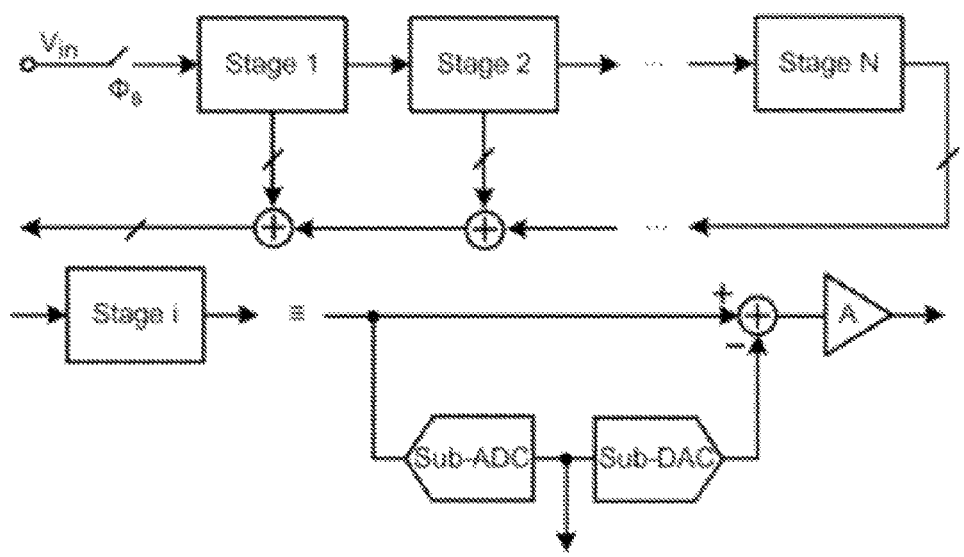
FIGS. 3A-3B illustrate a multistage ODC calibration in accordance with some embodiments of the present disclosure.
Figure 3B:
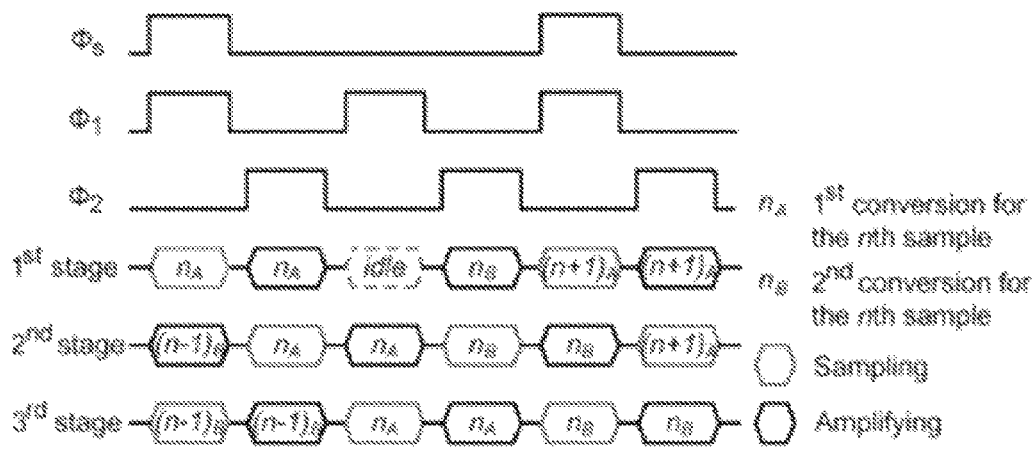

FIGS. 3A-3B illustrate a multistage ODC calibration, according to some embodiments of the present disclosure. That is, FIG. 3A illustrates the architecture of a multistage ADC, according to some embodiments of the present disclosure, and FIG. 3B illustrates a timing diagram resultant of the illustrated ODC calibration of FIG. 3A. In FIG. 3A, the ADC consists of multiple conversion stages with their timing modified; however, in some embodiments, the offset injection is performed only in the first stage. In FIG. 3B, the timing for the first stage is different from that of the following stages. For the first stage, an input sample is acquired once every two conversions; whereas, for the other stages, a normal sampling operation is employed. In some embodiments, such timing modification ensures double conversion for every sample at the cost of a halved conversion speed. This calibration overhead can be lifted when operating in a foreground mode, wherein the double conversion is disabled after the foreground calibration is completed. An additional sampling phase is reserved for Φs, as discussed respective FIGS. 2 and 3 herein.

Figure 4:
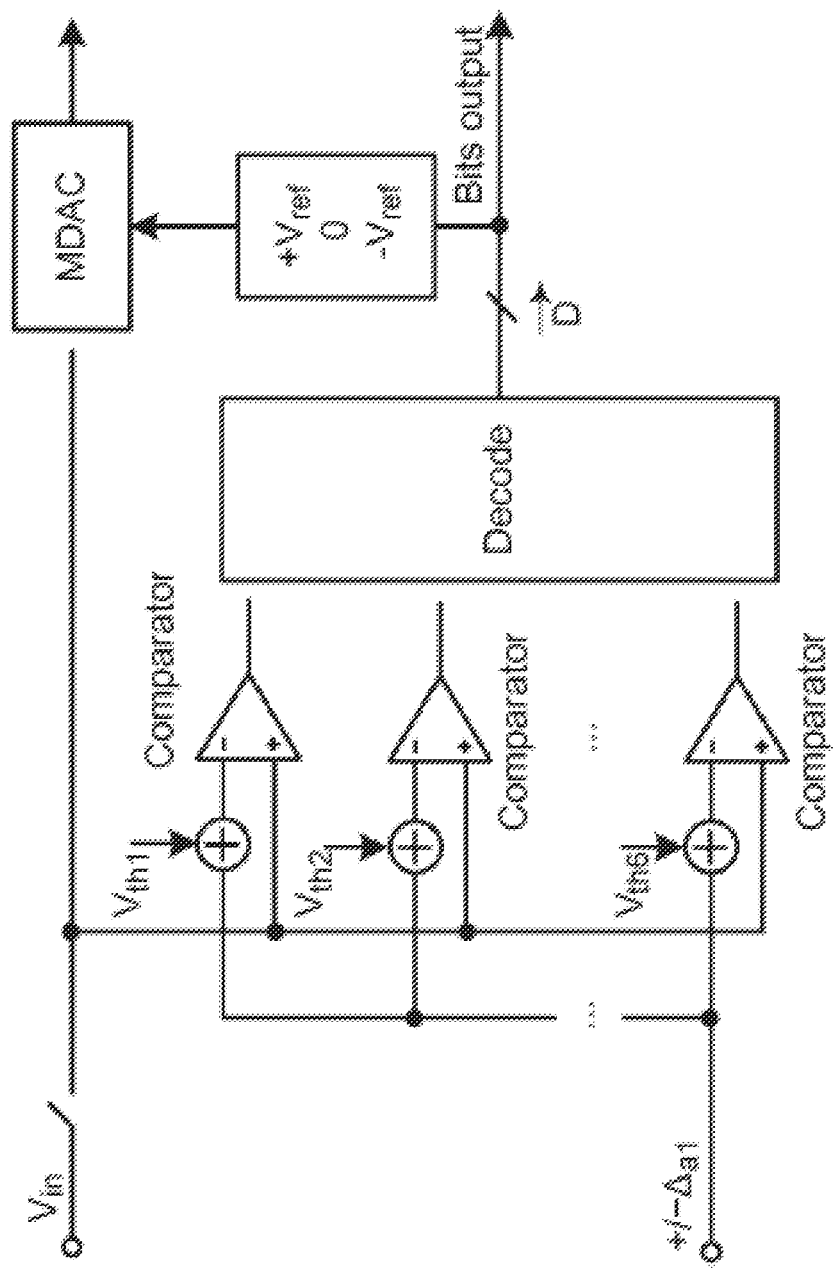
FIG. 4 illustrates a schematic of a non-limiting example of sub-ADC offset injection in accordance with some embodiments of the present disclosure.

According to some embodiments, in certain ADC implementations, e.g., pipelined ADCs without a dedicated sample-and-hold amplifier, the offset injection of Δa in the input signal path can be equivalently implemented in both the sub-ADC and sub-DAC paths of the first conversion stage. By way of a non-limiting example, a 2.5-bit pipelined ADC stage is assumed for illustrating how such calibration/implementation is effectuated. Reference to FIG. 4 is made here to provide support for the offset injection in the first stage of the sub-ADC. That is, the sub-ADC offset injection scheme is shown in FIG. 4, where +/−Δa1 influences the original threshold of each comparator for two consecutive conversions. For each sample, it can be assumed that +Δa1 is added during the first conversion, whereas −Δa1 is added during the second conversion. Thus, in some embodiments, with the offset injection in the sub-ADC, the conversion trajectories of the two consecutive conversions may or may not be different, depending on whether the injection results in a different code, which is further illustrated by the residue transfer curves of the stage with and without offset, illustrated in FIG. 6A.

Figure 5A:
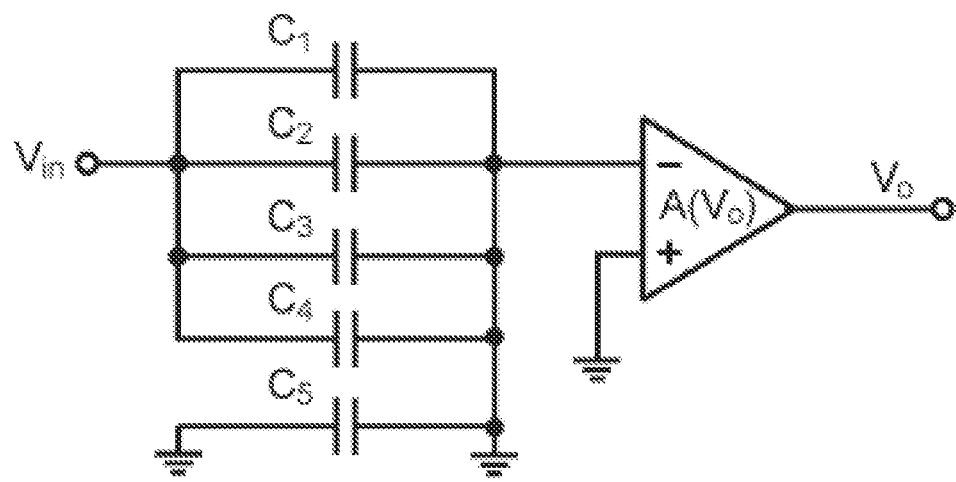
FIGS. 5A-5B illustrate schematic examples of a sub-ADC offset injection configurations in accordance with some embodiments of the present disclosure.
Figure 5B:
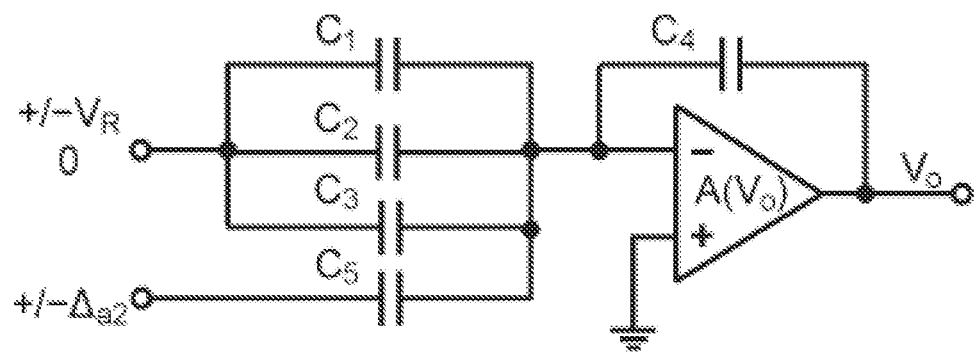
Figure 6A:
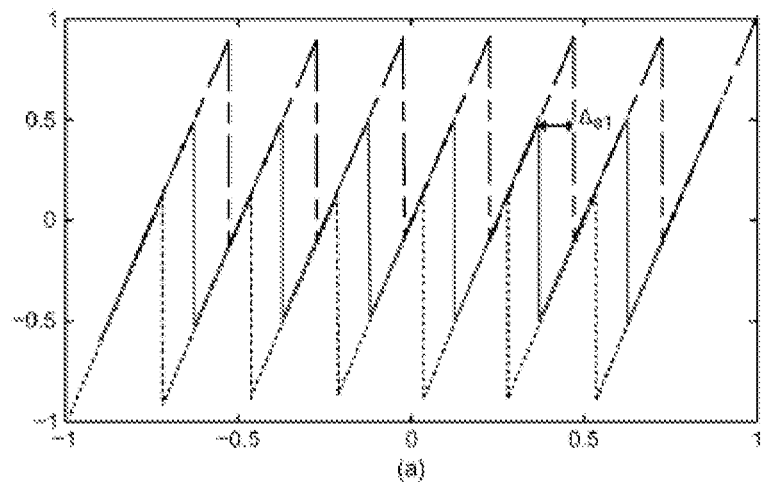
FIGS. 6A-6C illustrate examples of residue transfer curves with offset injections in accordance with some embodiments of the present disclosure.

As shown in FIG. 6A, $\Delta_{a1}$ introduces a horizontal shift in the decision thresholds of the curve. In some embodiments employing digital redundancy, the effect of $\Delta_{a1}$ is absorbed into the redundancy as long as the magnitude of injection is less than the comparator offset tolerance range of the architecture. That is, in some embodiments, $\Delta_{a1}$ does not need to be subtracted out in the digital domain. The sub-DAC injection can be implemented in the MDAC as shown in FIGS. 5A and 5B, in which an extra capacitor C5 (<<C1=C2=C3=C4 nominally) adds an offset +/−$\Delta_{a2}$ to the two consecutive conversions. As illustrated, FIG. 5A illustrates the schematic of a sampling-phase configuration, and FIG. 5B illustrates an amplifying phase configuration. For each sample, in some embodiments, it can be assumed that the extra capacitor samples +$\Delta_{a2}$ in the first amplifying phase and −Δa2 in the second amplifying phase. Thus, in some embodiments, the residue voltages of the conversions A and B can be expressed as:

$$V_{oA} = \frac{V_i \sum_{l=1}^{4} C_l - V_R \sum_{m=1}^{3} d_{m,A} C_m - \Delta_{a2} C_5 + V_{a3}}{C_4 \left(1 + \frac{\sum_{n=1}^{5} C_n}{C_4 A(V_{oA})}\right)} \quad (5)$$

$$V_{oB} = \frac{V_i \sum_{l=1}^{4} C_l - V_R \sum_{m=1}^{3} d_{m,B} C_m + \Delta_{a2} C_5 + V_{a3}}{C_4 \left(1 + \frac{\sum_{n=1}^{5} C_n}{C_4 A(V_{oB})}\right)}.$$

Figure 6B:
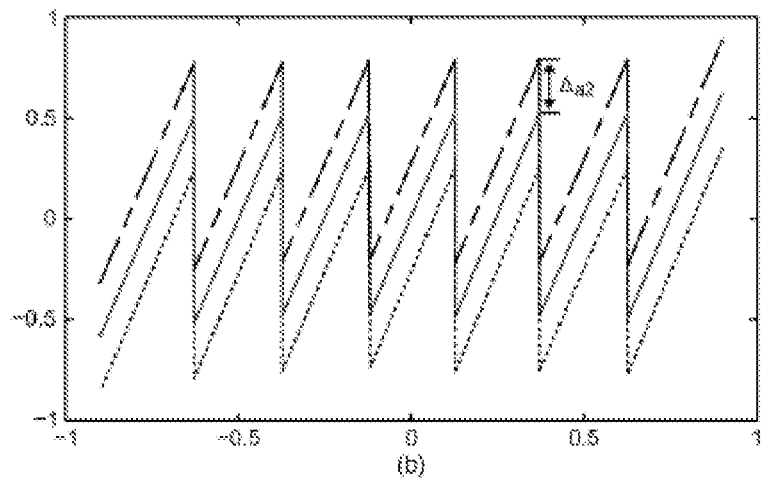
Figure 6C:
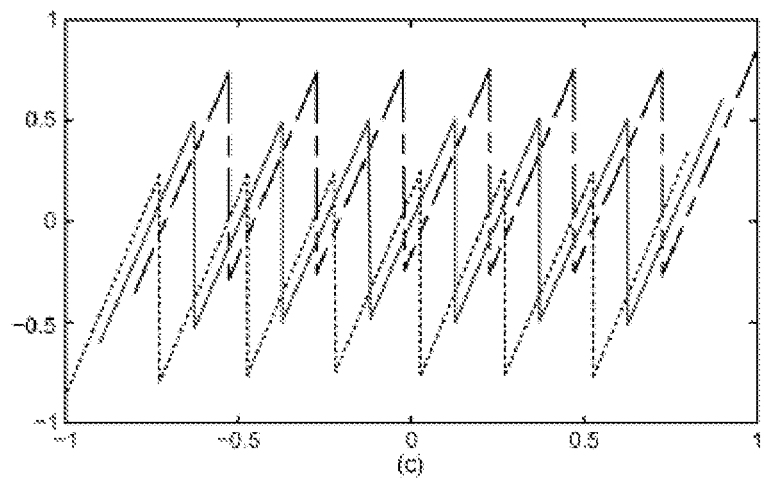

Here, VR is the reference voltage, Vos is the lumped offset voltage, A(Vo) is the signal-dependent op-amp gain with both finite value and nonlinearity, and D=[d1,A/B d2,A/B d3,A/B] is the 3-bit digital decision of the stage with di,A/B (for 1≤i_≤3), assuming a value of −1 or 1. The term C4A(Vo)/5 n=1 Cn is the loop gain of the residue amplifier. When referred to the input, the effective offset introduced is −/+C5Δa2/_4 l=1 Cl. As seen in (5), only the sub-DAC offset Δa2 shows up in the conversion output, which needs to be subtracted out in the digital domain. This implies that Da should equal Δa2. In addition, due to the different effects of Δa1 and Δa2 impressing on the residue transfer curve and the fact that only Δa2 needs to be removed eventually, Δa1 and Δa2 do not need to be precisely matched in the analog domain. In addition, the perturbation of comparison threshold by Δa1 does not need to be uniform for all six comparators considering the redundancy. These two observations will significantly simplify the circuit implementation of the proposed offset injection scheme. The transfer curve of the stage with sub-DAC offset injection alone is shown in FIG. 6B, wherein Δa2 introduces a vertical shift of the curve and hence degrades the input dynamic range and comparator offset tolerance. As both sub-ADC and sub-DAC injections result in a loss of comparator offset tolerance as illustrated in FIGS. 6A and 6B, the two can be chosen such that their effects on the residual curve largely cancel each other. This is illustrated in FIG. 6C with both injections enabled, where Δa1 and Δa2 are deliberately chosen to be different for generality. In some embodiments, due to the equalization nature of the approach, only the first ADC stage needs to be modified, which leads to a much reduced complexity of circuit implementation and, thus, a low analog overhead.

Figure 7:
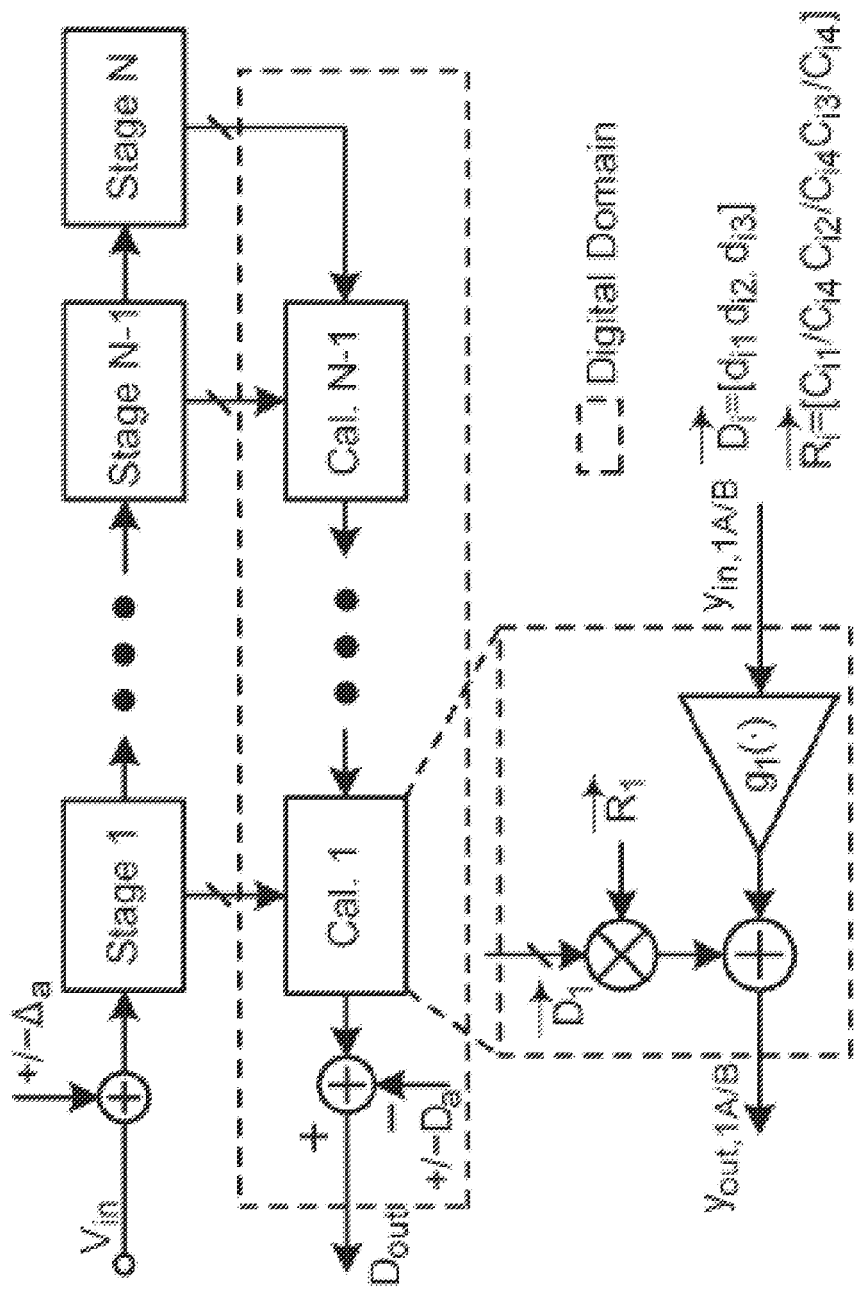
FIG. 7 illustrates a schematic diagram for self-equalization of a multi-stage ADC in accordance with some embodiments of the present disclosure.

FIG. 7 illustrates an embodiment using a linearization technique of a self-equalized multi-stage ADC, based upon ODC to calibrate the non-linearity as discussed herein. FIG. 7 depicts a system diagram of self-equalization with ODC calibration. For clarification and discussion purposes only, again 2.5 bit architecture is utilized for discussion. It should be understood that such type of architecture is non-limiting, and should not be construed to limit the type and expansiveness of the architecture applicable to systems and methods discussed respective the present disclosure. Additionally, the residue amplifier nonlinearity can be modeled as an output dependent polynomial. As shown in FIG. 7, an Mth i-order digital polynomial gi(•) (1≤i≤N−1) is utilized to post-process the ith-stage residue output to remove its distortions. Vector Di=[di, 1A/B di,2A/B di,3A/B] is the ith-stage 3-bit output; vector Ri=[ri,1 ri,2 ri,3] captures the normalized ratios of the MDAC capacitors in the ith stage, with ri,k=Ci,k/Ci,4 (for 1≤k≤3). For the ith stage, the calibration output can be expressed as:

$$y_{out,iA/B} = \sum_{k=1}^{3} d_{i,kA/B} r_{i,k} + \sum_{j=1}^{M} g_{i,j} y_{in,iA/B}^{j} \quad (6)$$

where {gi,j for 1≤j≤M} represent the polynomial coefficients of gi(•), and yin,iA/B and yout,iA/B represent the ith-stage calibration input and output for the double conversion, respectively. The error e can then be expressed as the difference between the two calibration outputs of the first stage:

$$\epsilon = y_{out,1A} - y_{out,1B} - 2D_a \quad (7)$$

where yout,1A and yout,1B are the two conversion results of the same input sample after digital correction, respectively. As discussed above, all error parameters of the multistage pipelined ADC can be derived simultaneously by observing e. In some embodiments, an LMS algorithm is utilized in the learning process; however, it should be understood that any machine learning algorithm, whether known or to be known are applicable to the disclosed techniques discussed herein. As such, the update equations are:

$$g_{i,j}(n+1) = g_{i,j}(n) - \mu_{i,j} \cdot \epsilon \cdot (y_{in,iA}^{j} - y_{in,iB}^{j}) \quad (8)$$

$$r_{i,k}(n+1)=r_{i,k}(n)-\mu_{ri,k}\cdot\epsilon\cdot(d_{i,kA}-d_{i,kB}) \quad (9)$$

where n is the iteration index, $\{\mu,j\}$ are the step sizes for the adaptive polynomial filter, $\{\mu ri,k\}$ are the step sizes for learning the capacitor mismatch coefficients, and the subscripts A and B refer to the double conversion results. In addition, the update equation for Da is:

$$D_a(n+1)=D_a(n)+\mu_{os}\cdot\epsilon \quad (10)$$

where $\mu os$ is the step size for the offset mismatch correction.

Thus, the above discussion respective FIGS. 1-7 provide for an equalization technique via ODC for digitally calibrating ADC in order to correct mismatch errors and non-linearalities. In some embodiments, such techniques can calibrate the ADC and all sub-stages therewith simultaneously. Indeed, improvements in signal-to-noise-distortion ratio (SNDR) and spurious-free dynamic range (SFDR) performance have been realized (e.g., improvements of SFDR performance by at least 40 dB), as well as fast convergence. Indeed, the linearization techniques can utilize dynamic offset injection, as discussed above, which is built upon offset double conversion (ODC). This enables calibration of the non-linearity of the front-end buffer of IF-sampling ADCs. As discussed above, the disclosed calibration operates in the background without the need of stopping normal operation. By implementing the disclosed systems and methods, the front-end buffer can be integrated with the ADC core in scaled process nodes. Thus, the present disclosure describes techniques for significantly decreasing the power consumption and manufacture costs of IF-sampling ADCs. Indeed, discussed in more detail below, the calibration algorithm can be applied to split-ADC architecture, as illustrated in FIGS. 9-10, which enables the avoidance of a speed penalty.

Figure 8:
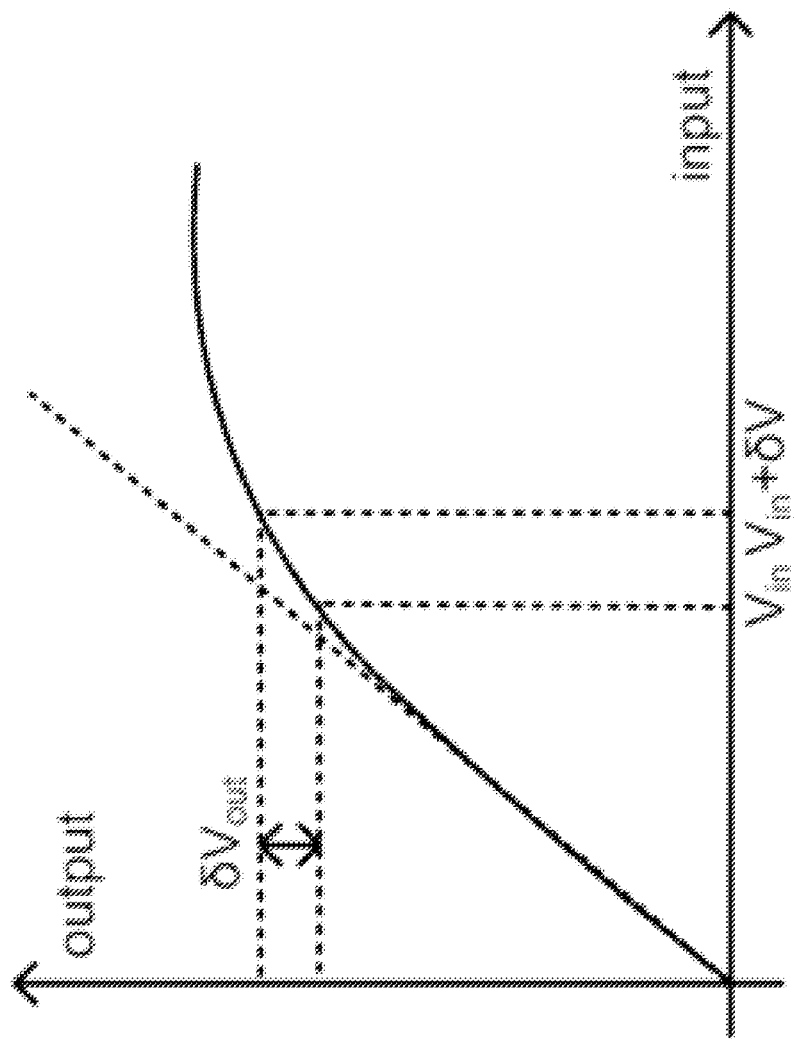
FIG. 8 illustrates an example of a superposition principle applicable to the present disclosure in accordance with some embodiments.
Figure 9:
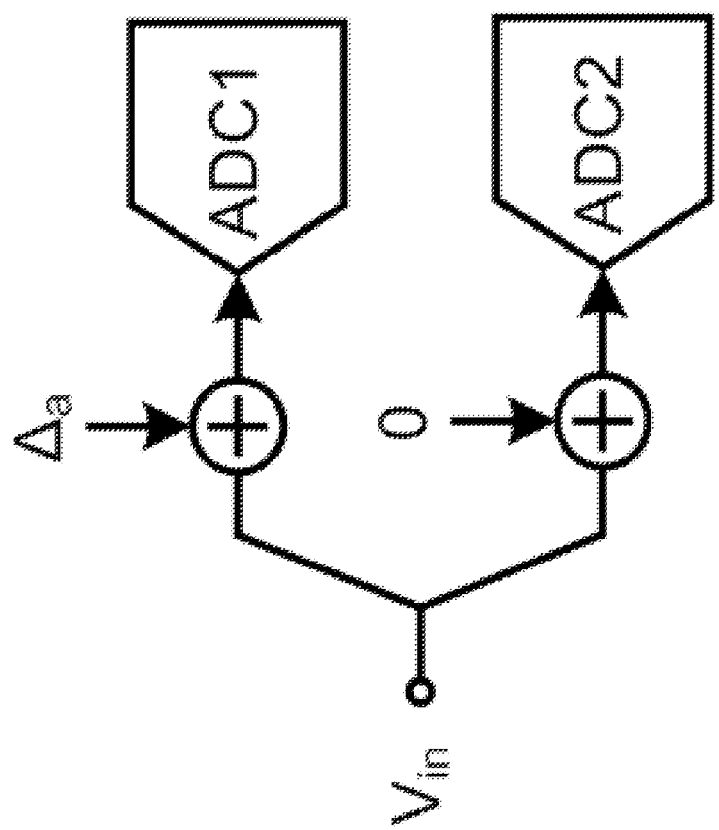
FIG. 9 illustrates a split-ADC architecture in accordance with some embodiments of the present disclosure.

Based on the above discussion, compounding the discussion of ODC to enable the linearization techniques for IF sampling in CMOS ADC front-end via digital calibration, FIGS. 8-10 illustrate static nonlinearity correction techniques for linearizing wideband IF-sampling ADC front-end circuits.

As discussed above, the present disclosure involves a digital background calibration technique for linearizing the front-end circuits of IF-sampling ADCs. The disclosed systems and methods employ a power series model to eliminate the static non-linearity with split-ADC architecture and LMS algorithm for background learning. The present disclosure utilizes a technique for applying two dynamic offset signals to the input of two conversion paths in the split-ADC architecture. When the system nonlinearity is successfully calibrated, the output difference between the two conversion paths results in a fixed offset that is identical to the offset injected at the input. The disclosed digital background calibration technique can linearize the front-end circuits of high-speed ADCs and significantly reduce power consumption.

The disclosed systems and methods can correct the static and dynamic non-linearalities. In some embodiments, a simple power series model is used to eliminate the static nonlinearity with the split-ADC architecture and the LMS algorithm is used for background learning. In linear systems, the law of superposition should always hold. For a linear system described by a transfer function h(x), as discussed above, the following equation must hold for any input signal x and any offset:

$$h(x+D)-h(x)=h(x)-h(x-D)=\text{const} \quad (11)$$

As illustrated in FIG. 8, if a constant offset is added to the input of a linear transfer function, a certain constant offset at the output should be observed. Based on this concept, the disclosed linearization scheme for static nonlinearity is derived from a technique termed offset double conversion (ODC), as discussed above.

Therefore, as shown in FIG. 9 (in connection with the above discussion respective FIGS. 2-7), the input is split into two different signal paths in the split-ADC architecture. Here, a small offset can be added to the input of the upper signal path, where the input of lower signal path is kept intact. In some embodiments, if the whole system is completely linearized with calibration, a constant difference between the outputs of the two signal paths should be realized. According to some embodiments, this static nonlinearity correction scheme can be (or is mainly) applied to calibrate the nonlinearity stemming from the input buffer of the ADC front-end. The transfer function of the input buffer is assumed to be a polynomial function as shown below:

$$V_{out}=a_0+a_1V_{in}+a_2V_{in}^2+a_3V_{in}^3+\text{/}1;4 \quad (12)$$

Figure 10A:
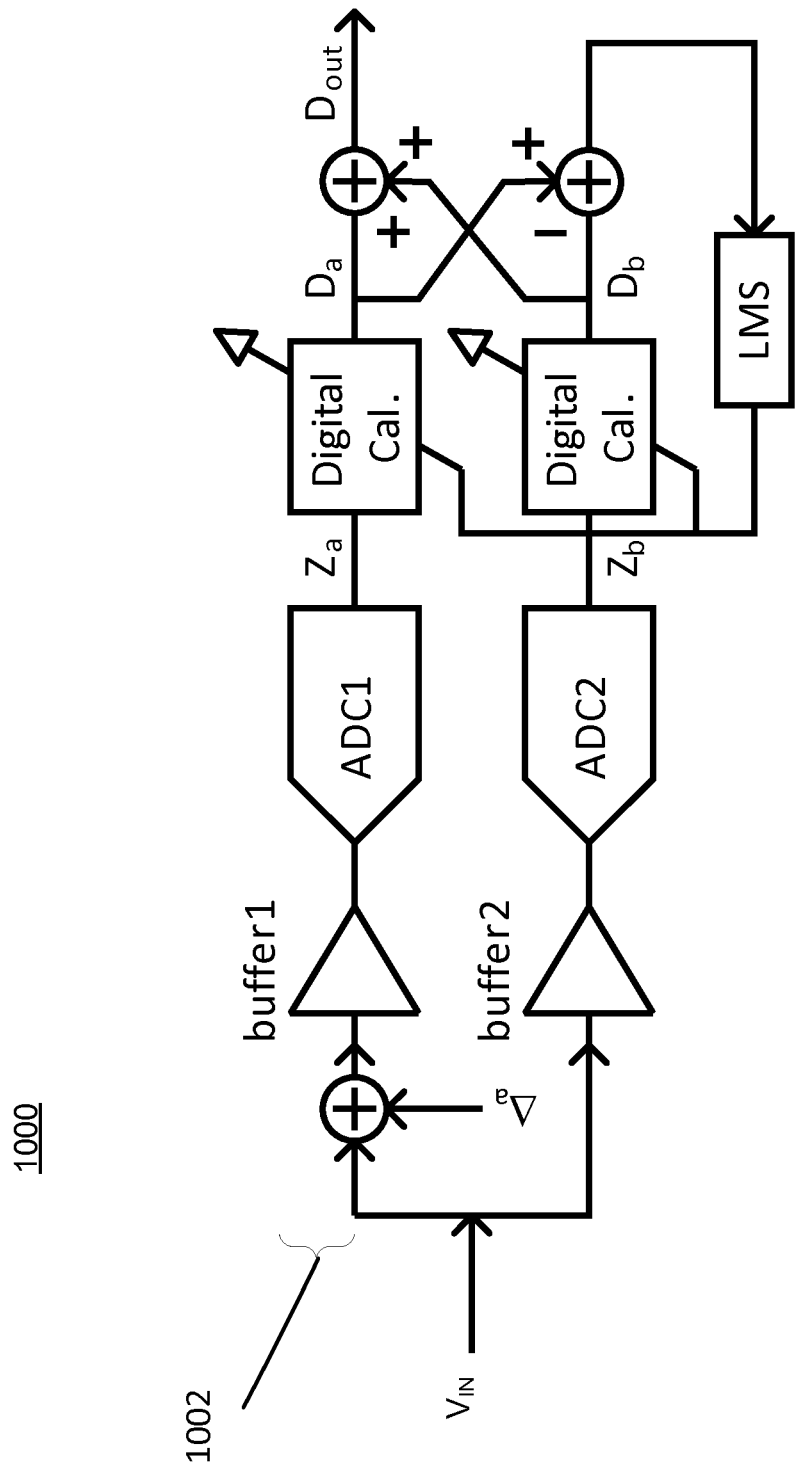
FIGS. 10A-10B illustrate a schematic block diagrams of non-linearity correction architecture in accordance with some embodiments of the present disclosure.
Figure 10B:
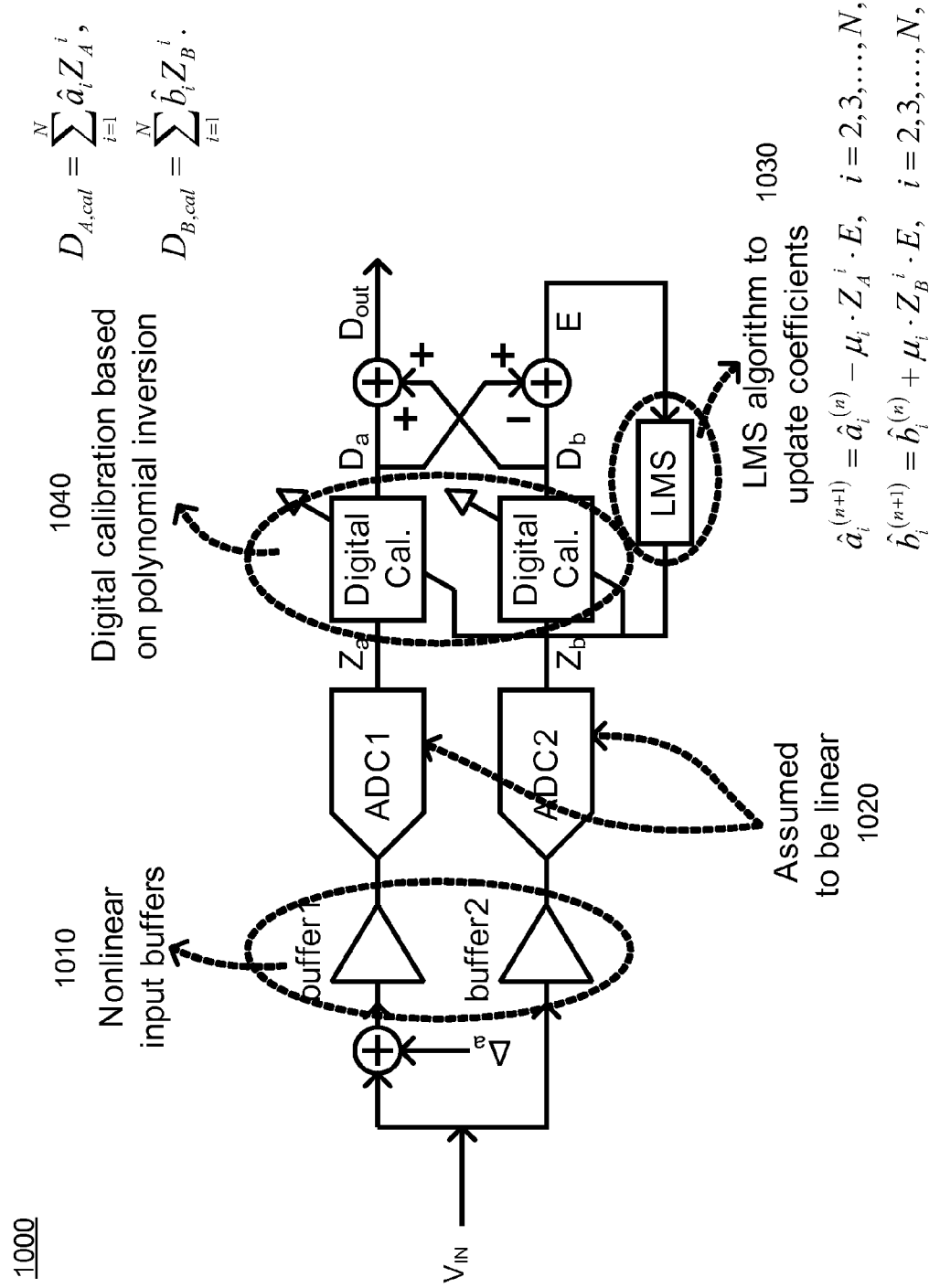

Thus, based on the above, the overall non-linearity correction architecture is illustrated in FIGS. 10A and 10B. As in FIG. 10A, a constant offset is injected into the input of the upper signal path 1002. Additionally, the polynomial coefficients are constantly adjusted using LMS algorithm (or other known or to be known learning algorithms) until the output difference between the two signal-paths becomes a constant value, as discussed in more detail below respective FIGS. 10A and 11.

Figure 11:
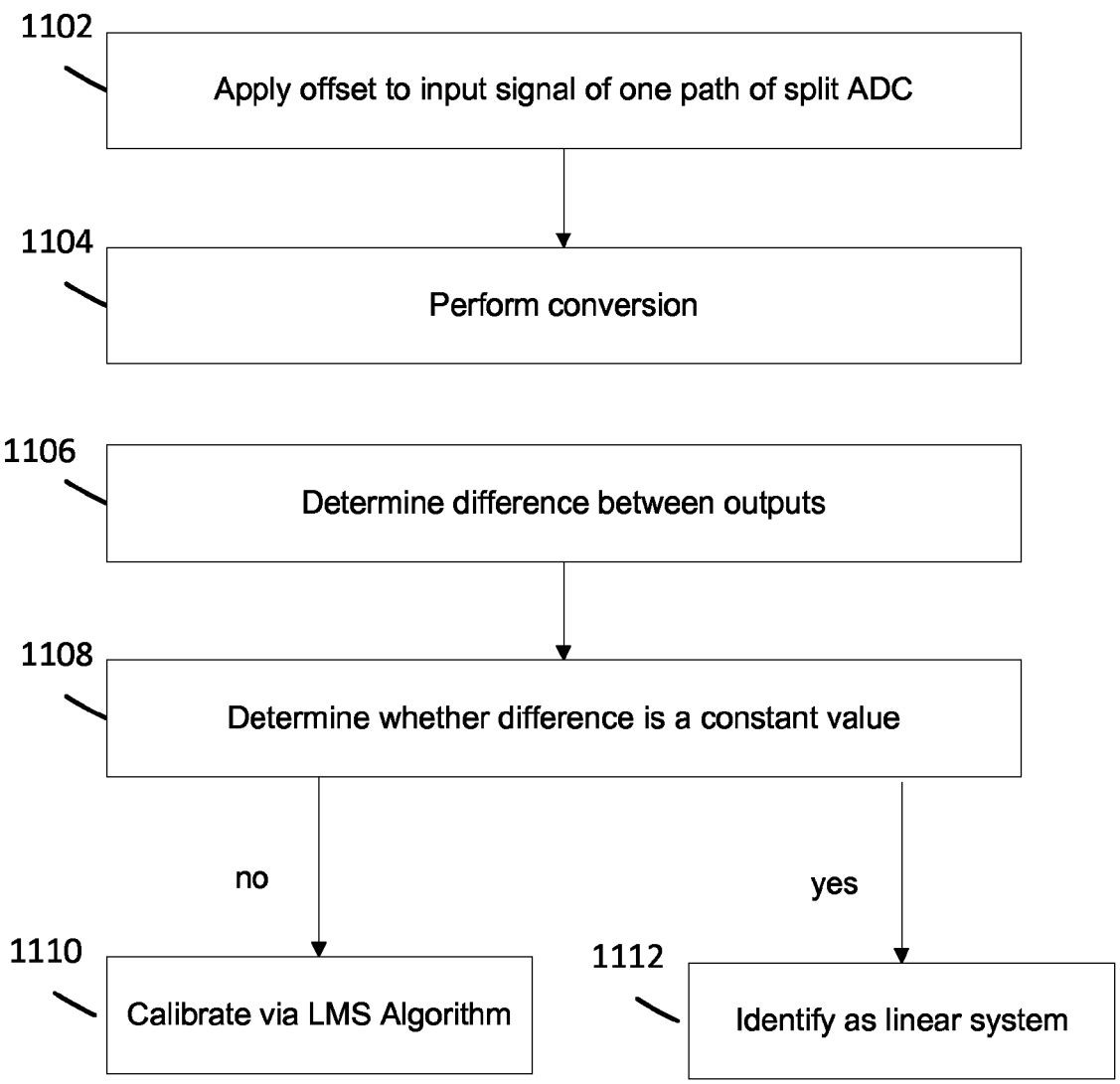
FIG. 11 is a flow diagram in accordance with some embodiments of the present disclosure.

FIG. 11 is a flow diagram involving the application and implementation of the calibration/linearization technique discussed above, effective the above Figures, especially FIG. 10. As discussed herein, the present disclosure provides systems and methods that can linearize the front-end circuits of high-speed ADC and significantly reduce power consumption. As discussed herein, an ADC application such as, but not limited to, sampling at an Intermediate Frequency (IF) is an attractive method for minimizing component count and system cost. By applying such disclosed techniques, one or more steps of down-conversion are removed from the receiver path and some of the analog front-end signal processing functions can be moved to the digital domain. As discussed in more detail herein, the disclosed systems and methods employ a digital background calibration technique for use in intermediate-frequency (IF) sampling ADCs. That is, the present disclosure provides for digital background calibration techniques that linearize the front-end circuits of IF-sampling ADCs. The disclosed linearization techniques utilize dynamic offset injection, built upon offset double conversion (ODC), to calibrate the non-linearity of the front-end buffer of IF-sampling ADCs. The disclosed calibration operates in the background without the need of stopping normal operation. In some embodiments, a power series model is utilized to eliminate the static non-linearity with split-ADC architecture and a least means square (LMS) algorithm/filter for background learning. As discussed in more detail below, the present disclosure utilizes a technique(s) for applying two different offset signals to the input of two conversion paths in the split-ADC architecture. When the system nonlinearity is successfully calibrated, the output difference between the two conversion paths results in a fixed offset that is identical to the difference between the offset signals injected at the input. Therefore, as discussed in more detail below, the present disclosure describes techniques for linearizing the front-end circuits of ADCs, and significantly decreasing the power consumption and manufacture costs of such IF-sampling ADCs.

Process 1100 is based on, as discussed above, the law of superposition. That is, the calibration scheme process 1100 is an equalization-based approach. As shown in FIG. 10A, an offset $\Delta_a$ is applied to the input signal of the one signal path (top path 1002) in the split ADC architecture 1000. Step 1102. In some embodiments, the input buffer (buffer 1) can be a memory-less non-linear system, as its transfer function can be approximated by a power series, as discussed above. (As discussed in more detail below, the input buffers: buffer 1 and buffer 2 are non-linear input buffers—item 1010). Thus, in some embodiments, the ADCs may be assumed to be ideal (e.g., ADC1 and ADC2 are assumed to linear—item 1020). The conversion results for different signal paths results is given by:

$$Z_a = \sum_{n=1}^{\infty} a_n (V_{in} + \Delta_a)^n \qquad (13)$$

$$Z_b = \sum_{n=1}^{\infty} b_n V_{in}^n$$

Therefore, based on this, in Step 1104, a conversion is performed based on the equations of (13). In some embodiments the conversion is performed in accordance with the ADCs being ideal. In Step 1106, the difference between the two outputs ($Z_a$ and $Z_b$) are determined. Specifically, the difference between the two outputs is:

$$e = Z_a - Z_b = (a_1 - b_1)V_{in} + a_1\Delta_a + \sum_{n=2}^{\infty} (a_n(V_{in} + \Delta_a)^n - b_n V_{in}^n) \qquad (14)$$

In accordance with some embodiments, $a_1 = b_1$ and $a_i = b_i = 0$ for all $i \geq 2$ and the difference should be a constant value. Therefore, in Step 1108, a determination is made regarding whether the difference is a constant value. If the difference is a constant value, then proceed to Step 1112 to recognize that the system is linear. In some embodiments, a non-constant difference provides information to calibrate the nonlinear system. Therefore, in Step 1110 the LMS algorithm can be used here to learn the coefficients in the calibration model. That is, the a calibration model is applied to the non-linear system in accordance with the LMS model, as discussed above, and in more detail herein. Step 1110 involves at least the steps comprising: first, a series inversion on the ADC output to recover the original signal (i.e., digital calibration based on polynomial conversion—item 1040):

$$D_{A,cal} = \sum_{i=1}^{N} \hat{a}_i Z_A^i, \qquad (15)$$

$$D_{B,cal} = \sum_{i=1}^{N} \hat{b}_i Z_B^i.$$

The LMS update equation is shown as follows (to update coefficients—item 1030) (where E is the output difference between the two signal paths):

$$\hat{a}_i^{(n+1)} = \hat{a}_i^{(n)} - \mu_i \cdot Z_A^i \cdot E, \ i=2, 3, \ldots, N,$$

$$\hat{b}_i^{(n+1)} = \hat{b}_i^{(n)} - \mu_i \cdot Z_B^i \cdot E, \ i=2, 3, \ldots, N, \qquad (16)$$

$$E = D_{A,cal} - D_{B,cal} + \Delta_a \qquad (17)$$

Therefore, as a result, the LMS algorithm will force the difference to be zero. After process 1100 finishes, the input buffers in the two signal paths are both linearized. The flowchart steps, and results of the linearization/calibration are depicted in FIG. 10B.

Therefore, as discussed above, the present disclosure involves dynamic offset injection for CMOS ADC front-end linearization which involves a digital background calibration technique. The present disclosure improves the linearity of the front-end buffer that limits ADC performance at intermediate frequencies. The disclosed systems and methods also integrate front-end buffer with the ADC core in scaled process nodes, thereby reducing the power consumption and decreasing the manufacturing cost of IF-sampling ADCs. As discussed above in detail, the disclosed linearization scheme is derived from the offset double conversion (ODC) technique. The disclosed linearization scheme eliminates static nonlinearity with split-ADC architecture. In some embodiments, an LMS (or equivalent known or to be known) algorithm for background learning is utilized. As discussed above, the systems and methods discussed herein utilize dynamic offset injection to calibrate the nonlinearity of the front-end buffer of IF-sampling ADCs, which involves a calibration that operates in background without the need of stopping normal operation. When the system nonlinearity is successfully calibrated, the output difference between the two conversion paths should be a fixed offset, and the fixed offset is identical to the offset injected at the input.

For the purposes of this disclosure a module is a software, hardware, or firmware (or combinations thereof) system, process or functionality, or component thereof, that performs or facilitates the processes, features, and/or functions described herein (with or without human interaction or augmentation).

Those skilled in the art will recognize that the systems of the present disclosure may be implemented in many manners and as such are not to be limited by the foregoing exemplary embodiments and examples. In other words, functional elements being performed by single or multiple components, in various combinations of hardware and software or firmware, and individual functions, may be distributed among software applications at either the client level or server level or both. In this regard, any number of the features of the different embodiments described herein may be combined into single or multiple embodiments, and alternate embodiments having fewer than, or more than, all of the features described herein are possible.

Functionality may also be, in whole or in part, distributed among multiple components, in manners now known or to become known. Thus, myriad software/hardware/firmware combinations are possible in achieving the functions, features, interfaces and preferences described herein. Moreover, the scope of the present disclosure covers conventionally known manners for carrying out the described features and functions and interfaces, as well as those variations and modifications that may be made to the hardware or software or firmware components described herein as would be understood by those skilled in the art now and hereafter.

Furthermore, the embodiments presented and described in this disclosure are provided by way of example in order to provide a more complete understanding of the technology. The disclosure is not limited to the operations any logical flow or presentation presented herein. Alternative embodiments are contemplated in which the order of the various operations is altered and in which sub-operations described as being part of a larger operation are performed independently.

While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure.

What is claimed is:

1. A method for calibrating split analog-to-digital (ADC) architecture, comprising:
  receiving, along a first signal path comprising a first input buffer associated with a first ADC of said split ADC, an input signal;
  receiving, along a second signal path comprising a second input buffer associated with a second ADC of said split ADC, said input signal, said input signal split between said first signal path and said second signal path;
  applying an offset to the first signal path;
  determining, via each split ADC, conversion results for the first signal path and the second signal path, said conversion result for the first signal path is based upon said applied offset; and
  determining a difference between each conversion result,
    wherein if said difference corresponds to a non-constant value, calibrating the split ADC via application of a learning algorithm, and
    wherein if said difference corresponds to a constant value, identifying the split ADC as a linear system.

2. The method of claim 1, further comprising:
  performing a series inversion on the ADC conversion result to recover the input signal.

3. The method of claim 2, wherein said series inversion comprises:

$$D_{A,cal} = \sum_{i=1}^{N} \hat{a}_i Z_A^i$$

$$D_{B,cal} = \sum_{i=1}^{N} \hat{b}_i Z_B^i.$$

4. The method of claim 1, wherein said learning algorithm is the least means square (LMS) algorithm.

5. The method of claim 4, wherein said LMS algorithm comprises:

$$\hat{a}_i^{(n+1)} = \hat{a}_i^{(n)} - \mu_i \cdot Z_A^i \cdot E, i=2, 3, \ldots, N, \text{ and}$$

$$\hat{b}_i^{(n+1)} = \hat{b}_i^{(n)} - \mu_i \cdot Z_B^i \cdot E, i=2, 3, \ldots, N.$$

6. The method of claim 5, wherein E is the output difference between the first signal path and the second signal path: $E = D_{A,cal} - D_{B,cal} + \Delta_a$.

7. The method of claim 4, further comprising:
  applying the LMS algorithm to the non-constant difference value, wherein said application of the LMS algorithm forces the difference value to equal zero.

8. The method of claim 1, wherein said calibration is performed in the background and in the digital domain, said calibration based, in part, upon offset double conversion (ODC).

9. The method of claim 1, wherein said conversion results of each signal path equals:

$$Z_a = \sum_{n=1}^{\infty} a_n (V_{in} + \Delta_a)^n$$

$$Z_b = \sum_{n=1}^{\infty} b_n V_{in}^n,$$

where Za relates to the first signal path output, and wherein Zb relates to the second signal path output.

10. The method of claim 9, wherein said determination of the difference between the conversion results is:

$$e = Z_a - Z_b = (a_1 - b_1)V_{in} + a_1\Delta_a + \sum_{n=2}^{\infty} (a_n(V_{in} + \Delta_a)^n - b_n V_{in}^n).$$

11. A split analog-to-digital (ADC) system comprising:
  learning algorithm logic implemented via architecture of the split ADC;
  a first signal path, said first signal path comprising a first buffer, first ADC and first digital calibration logic for calibrating an output of the first ADC based on an output of the learning algorithm logic, said first signal path comprising input for applying an offset to a split input signal; and
  a second signal path, said second signal path comprising a second buffer, second ADC and second digital calibration logic for calibrating an output of the second ADC based on the output of the learning algorithm.

12. The split ADC system of claim 11, wherein said learning algorithm logic comprises the application of a least means square (LMS) algorithm.

13. The split ADC system of claim 11, further comprising:
  said second digital calibration logic performing a series inversion on the second signal path conversion result to recover the input signal.

14. The split ADC system of claim 13, wherein said series inversion comprises:

$$D_{A,cal} = \sum_{i=1}^{N} \hat{a}_i Z_A^i,$$

$$D_{B,cal} = \sum_{i=1}^{N} \hat{b}_i Z_B^i.$$

15. The split ADC system of claim 12, wherein said LMS algorithm comprises:

$$\hat{a}_i^{(n+1)} = \hat{a}_i^{(n)} - \mu_i \cdot Z_A^i \cdot E, i=2, 3, \ldots, N, \text{ and}$$

$$\hat{b}_i^{(n+1)} = \hat{b}_i^{(n)} - \mu_i \cdot Z_B^i \cdot E, i=2, 3, \ldots, N.$$

16. The split ADC system of claim 15, wherein E is the output difference between the first signal path and the second signal path: $E = D_{A,cal} - D_{B,cal} + \Delta_a$.

17. The split ADC system of claim 12, further comprising:
  applying the LMS algorithm to the non-constant difference value, wherein said application of the LMS algorithm forces the difference value to equal zero.

18. The split ADC system of claim 11, further comprising:
  approximating the first input buffer by a power series; and
  approximating the second input buffer by a power series, wherein said power series equals:

$$h(x) = \sum_{i=1}^{\infty} h_i x^i$$

where x is the input sample, {hi for i≥1} are the coefficients of the polynomial.

19. The split ADC system of claim 11, wherein said learning algorithm logic and said calibration of the first and second signal paths are performed in the background and in the digital domain.

20. The split ADC system of claim 11, wherein said conversion results of each signal path equals:

$$Z_a = \sum_{n=1}^{\infty} a_n (V_{in} + \Delta_a)^n$$

$$Z_b = \sum_{n=1}^{\infty} b_n V_{in}^n,$$

where Za relates to the first signal path output, and
wherein Zb relates to the second signal path output,
wherein said determination of the difference between the conversion results is:

$$e = Z_a - Z_b = (a_1 - b_1)V_{in} + a_1 \Delta_a + \sum_{n=2}^{\infty} (a_n(V_{in} + \Delta_a)^n - b_n V_{in}^n).$$

\* \* \* \* \*